(12) United States Patent
Lungu

(10) Patent No.: US 8,790,862 B2
(45) Date of Patent: *Jul. 29, 2014

(54) PHOTOSENSITIVE ELEMENT HAVING REINFORCING PARTICLES AND METHOD FOR PREPARING A PRINTING FORM FROM THE ELEMENT

(71) Applicant: E I du Pont de Nemours and Company, Wilmington, DE (US)

(72) Inventor: Adrian Lungu, Old Brridge, NJ (US)

(73) Assignee: E I du Pont de Nemours and Company, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/743,071

(22) Filed: Jan. 16, 2013

(65) Prior Publication Data

US 2013/0137043 A1    May 30, 2013

Related U.S. Application Data

(63) Continuation of application No. 12/231,587, filed on Sep. 4, 2008.

(60) Provisional application No. 60/993,762, filed on Sep. 14, 2007.

(51) Int. Cl.
 *B41N 1/00* (2006.01)
 *B41M 5/00* (2006.01)
 *G03F 7/00* (2006.01)
 *G03F 7/26* (2006.01)

(52) U.S. Cl.
 USPC .............. 430/270.1; 101/463.1; 430/300; 430/302; 430/306; 430/309

(58) Field of Classification Search
 CPC ........... B41C 1/00; B41C 1/003; B41C 1/10; B41C 2210/00; G03F 1/00; G03F 2007/00; G03F 9/00
 USPC ........... 430/270.1, 300–306; 101/450.1, 453, 101/463.1
 See application file for complete search history.

(56) References Cited

U.S. PATENT DOCUMENTS

| | | |
|---|---|---|
| 2,649,382 A | 8/1953 | Vesce |
| 2,760,863 A | 8/1956 | Plambeck, Jr. |
| 2,927,024 A | 3/1960 | Woodward et al. |
| 3,036,913 A | 5/1962 | Burg |
| 3,060,023 A | 10/1962 | Burg et al. |
| 3,264,103 A | 8/1966 | Cohen et al. |
| 3,380,831 A | 4/1968 | Cohen et al. |
| 3,458,311 A | 7/1969 | Alies |
| 3,620,726 A | 11/1971 | Chu et al. |
| 3,684,771 A | 8/1972 | Braun |
| 3,788,996 A | 1/1974 | Thompson |
| 3,796,602 A | 3/1974 | Briney et al. |
| 3,909,282 A | 9/1975 | Gray |
| 4,032,698 A | 6/1977 | Ashe |
| 4,045,231 A | 8/1977 | Toda et al. |
| 4,070,388 A | 1/1978 | Jones |
| 4,177,074 A | 12/1979 | Proskow |
| 4,273,857 A | 6/1981 | Leberzammer et al. |
| 4,293,635 A | 10/1981 | Flint et al. |
| 4,323,636 A | 4/1982 | Chen |
| 4,323,637 A | 4/1982 | Chen et al. |
| 4,427,759 A | 1/1984 | Gruetzmacher et al. |
| 4,430,417 A | 2/1984 | Heinz et al. |
| 4,431,723 A | 2/1984 | Proskow |
| 4,460,675 A | 7/1984 | Gruetzmacher et al. |
| 4,517,279 A | 5/1985 | Worns |
| 4,726,877 A | 2/1988 | Fryd et al. |
| 4,753,865 A | 6/1988 | Fryd et al. |
| 4,806,506 A | 2/1989 | Gibson, Jr. |
| 4,894,315 A | 1/1990 | Feinberg et al. |
| 4,956,252 A | 9/1990 | Fryd et al. |
| 5,015,556 A | 5/1991 | Martens |
| 5,175,072 A | 12/1992 | Martens |
| 5,215,859 A | 6/1993 | Martens |
| 5,262,275 A | 11/1993 | Fan |
| 5,279,697 A | 1/1994 | Peterson et al. |
| 5,292,617 A | 3/1994 | Feinberg et al. |
| 5,301,610 A | 4/1994 | McConnell |
| 5,506,086 A | 4/1996 | Van Zoeren |
| 5,607,814 A | 3/1997 | Fan et al. |
| 5,679,485 A | 10/1997 | Suzuki et al. |
| 5,707,773 A | 1/1998 | Grossman et al. |
| 5,719,009 A | 2/1998 | Fan |
| 5,766,819 A | 6/1998 | Blanchet-Fincher |

(Continued)

FOREIGN PATENT DOCUMENTS

| | | |
|---|---|---|
| DE | 38 28 551 | 3/1990 |
| EP | 0 017 927 | 9/1984 |
| EP | 1 422 563 A | 5/2004 |
| EP | 1 457 821 A | 9/2004 |
| JP | 53-008655 | 1/1978 |
| JP | 2002-244289 A | 8/2002 |
| JP | 2005 024893 A | 1/2005 |
| JP | 2005024893 A * | 1/2005 |
| JP | 2005-221735 A | 8/2005 |
| WO | WO2007/017298 | 2/2007 |
| WO | 2008-029777 A | 3/2008 |

OTHER PUBLICATIONS

IUPAC, Norrish type II photoinitiator (2010).*

(Continued)

*Primary Examiner* — Chanceity Robinson

(57) ABSTRACT

The invention provides a photosensitive element and a method for preparing a printing form from the element. The photosensitive element includes a layer of a photosensitive composition containing a binder, a monomer, and a Norrish type II photoinitiator, wherein the photosensitive layer has a transmittance to actinic radiation of less than 20% and contains reinforcing particles of graphene and/or carbon nanotubes.

16 Claims, No Drawings

(56) References Cited

U.S. PATENT DOCUMENTS

| | | |
|---|---|---|
| 5,798,202 A | 8/1998 | Cushner et al. |
| 5,804,353 A | 9/1998 | Cushner et al. |
| 5,830,621 A | 11/1998 | Suzuki et al. |
| 5,840,463 A | 11/1998 | Blanchet-Fincher |
| 5,863,704 A | 1/1999 | Sakurai et al. |
| 5,889,116 A | 3/1999 | Suzuki et al. |
| 6,025,098 A | 2/2000 | Sakurai et al. |
| 6,127,094 A * | 10/2000 | Victor et al. ............... 430/284.1 |
| 6,210,854 B1 | 4/2001 | Grossman et al. |
| 6,238,837 B1 | 5/2001 | Fan |
| 6,558,876 B1 | 5/2003 | Fan |
| 6,737,216 B2 | 5/2004 | Kannurpatti et al. |
| 6,773,859 B2 | 8/2004 | Fan et al. |
| 6,797,454 B1 | 9/2004 | Johnson et al. |
| 6,974,657 B2 * | 12/2005 | Berger et al. ............... 430/270.1 |
| 2001/0036591 A1 * | 11/2001 | Schulz et al. ............... 430/270.1 |
| 2004/0048199 A1 | 3/2004 | Schadebrodt et al. |
| 2004/0101634 A1 * | 5/2004 | Park et al. ............... 427/558 |
| 2006/0148392 A1 * | 7/2006 | Ono et al. ............... 451/526 |
| 2006/0166114 A1 * | 7/2006 | Lee ............... 430/7 |
| 2006/0257785 A1 * | 11/2006 | Johnson ............... 430/270.1 |
| 2008/0161476 A1 * | 7/2008 | Sugasaki ............... 524/496 |
| 2010/0189941 A1 | 7/2010 | Funakoshi et al. |

OTHER PUBLICATIONS

Chandler, et al.; Plastic Technology Handbook (1987) (Book Not Included).

Jakubauskas, H.K., Use of A-B Block Polymers as Dispersants for Non-aqueous Coating Systems, Journal of Coating Technology, vol. 58, No. 736, pp. 72-82.

\* cited by examiner

PHOTOSENSITIVE ELEMENT HAVING REINFORCING PARTICLES AND METHOD FOR PREPARING A PRINTING FORM FROM THE ELEMENT

BACKGROUND OF THE INVENTION

1. Field of the Disclosure

This invention pertains to a photosensitive element and a method for preparing a printing form from the element, and in particular to a photosensitive element having a photopolymerizable composition containing an additive and a method for treating the element to form a surface suitable for printing.

2. Description of Related Art

Flexographic printing plates are well known for use in printing surfaces which range from soft and easy to deform to relatively hard, such as packaging materials, e.g., cardboard, plastic films, aluminum foils, etc. Flexographic printing plates can be prepared from photosensitive elements containing photopolymerizable compositions, such as those described in U.S. Pat. Nos. 4,323,637 and 4,427759. The photopolymerizable compositions generally comprise an elastomeric binder, at least one monomer and a photoinitiator. Photosensitive elements generally have a photopolymerizable elastomeric layer interposed between a support and a coversheet or multilayer cover element. Upon imagewise exposure to actinic radiation, photopolymerization of the photopolymerizable layer occurs in the exposed areas, thereby curing and rendering insoluble the exposed areas of the layer. The element is treated with a suitable solution, e.g., solvent or aqueous-based washout, or thermally, to remove the unexposed areas of the photopolymerizable layer leaving a printing relief which can be used for flexographic printing.

In some instances it may be desirable to directly engrave the printing form with laser radiation of sufficient intensity to ablate the elastomeric material and form a surface, e.g., relief, suitable for printing. Photopolymerizable printing elements are often photochemically reinforced by overall exposing the element to actinic radiation before imagewise ablating with laser radiation. Particulate material that is sensitive to the laser radiation may be added to the photosensitive composition in order to enhance the engraving efficiency of the element and to reinforce the mechanical properties of the element.

U.S. Pat. Nos. 5,798,202 and 5,804,353 disclose process for make a flexographic printing plate by laser engraving one or multiply reinforced elastomeric layers on a flexible support. The process involves reinforcing and laser engraving the one or multiple reinforced elastomeric layers. The elastomeric layer can be reinforced mechanically, or photochemically, or thermochemically, or combinations thereof. Mechanical reinforcement is provided by incorporating reinforcing agents, such as finely divided particulate material, into the elastomeric layer. Carbon black and graphite are cited as suitable reinforcing agents. Photochemical reinforcement is accomplished by incorporating photohardenable materials into the elastomeric layer and exposing the layer to actinic radiation. Photohardenable materials include photocrosslinkable and photopolymerizable systems having a photoinitiator or photoinitiator system. Both patents provide examples of photosensitive elements that are only mechanically reinforced with carbon black, in which the amount of carbon black in the elastomeric layer was from 1 to 25% by weight of the elastomeric layer. Both patents also provide examples of photosensitive elements that are both reinforced mechanically with carbon black in the elastomeric layer and reinforced photochemically. However, in U.S. Pat. No. 5,798,202 the amount of the reinforcing agent in the elastomeric layer was considerably less (compared to elastomeric layers that were only mechanically reinforced) in order to photochemically reinforce the elastomeric layer which had 2-phenyl-2, 2-dimethoxy acetophenone (which is a derivative of acetophenone) as a photoinitiator. The amount of carbon black in the photosensitive elements of the examples where the elastomeric layer was mechanically and photochemically reinforced was less than 0.23% by weight of the elastomeric layer, so that the actinic radiation could adequately penetrate the layer and photochemically reinforce the element. An example of U.S. Pat. No. 5,804,353 prepared a multilayer plate in which a top layer of a photosensitive composition included carbon black as mechanical reinforcing particles at 18.7% by weight, and 2-isopropylthioxanthone and ethyl-p-dimethylaminobenzoate as a photoinitiator system. However, the multilayer plate was laser engraved for use as a flexographic printing plate.

Flexographic printing is a form of relief printing in which the printing form prints from an image area, where the image area of the printing form is raised and the non-image area is depressed. Gravure printing is a method of printing in which the printing form prints from an image area, where the image area is depressed and consists of small recessed cups or wells to contain the ink or printing material, and the non-image area is the surface of the form. However, gravure printing forms are expensive and require considerable time and material to produce. A gravure cylinder is essentially made by electroplating a copper or chrome layer onto a base roller, and then engraving the image composed of the small recessed cells or wells digitally by a diamond tipped or laser etching machine.

It is contemplated that the photopolymerizable relief printing form could be used for gravure-like printing. Gravure-like printing is similar to gravure printing except that a relief printing form is used wherein the image area is depressed and consists of recesses areas forming wells to carry the ink which transfer during printing. However, the mechanical properties, such as abrasion resistance, tensile strength, and stiffness of the photopolymerizable relief printing form would need to be enhanced in order for the element to effectively function as or similar to a conventional gravure cylinder. It is expected that the recessed areas of the elastomeric flexographic printing form that carry the ink could change volume during ink transfer or nip contact with the substrate rendering unacceptable image quality. Also, conventional gravure printing typically uses a doctor blade to regulate the amount of ink transferred to the recessed areas of a gravure cylinder. But the elastomeric flexographic printing form in gravure-like application is not likely sufficiently resistant to the abrasion and wear associated with continuous contact of the doctor blade. Hereto, particulate material may be added to the photosensitive composition in order to reinforce the mechanical properties of the element. A photopolymerizable printing form functioning for gravure-like printing could be easily imaged by laser engraving or by conventional imagewise exposure and treatment as described previously.

Additionally, the solvent resistance of the photopolymerizable relief printing form also needs to be enhanced in order for the printing form to effectively function as or similar to a conventional gravure cylinder. Most inks used in conventional gravure printing typically contain toluene, which is a potent solvent. An elastomeric flexographic printing form is not sufficiently resistant to toluene or other strong solvents, and may dissolve or swell upon contact with the ink, particularly over time. Swelling of the printing form on press will result in poor quality of the printed images. It is also possible that the solvent ink may cause some of the components from the printing for to leach out, which could cause complete failure of the printing form on press.

A problem associated with the photosensitive printing forms having an elastomeric layer which is reinforced both mechanically and photochemically is that laser engraving does not efficiently remove the elastomeric material to provide desired relief quality, and ultimately printing quality. Photochemically reinforcing the element can provide the desired properties for engraving as well as in its end-use as a printing plate. However, the presence of a particulate additive, like a reinforcing agent, tends to reduce the penetration of the ultraviolet radiation required to photochemically reinforce the element. If the elastomeric layer is insufficiently cured during photochemical reinforcement, the laser radiation cannot effectively remove the material and poor relief quality of the engraved area results. Further, the debris resulting from laser engraving tends to be tacky and is difficult to completely remove from the element. Additionally, if the element is not sufficiently photochemically reinforced the required end-use properties as a flexographic or gravure-like printing plate are not achieved. These problems tend to be exacerbated with increasing concentration of the additive that enhances engraving efficacy or the mechanical properties for gravure-like printing.

SUMMARY OF THE INVENTION

The present invention provides a photosensitive element for use as a printing form comprising a layer of a photosensitive composition comprising a binder, a monomer, and a Norrish type II photoinitiator, wherein the photosensitive layer contains reinforcing particles that provide the layer with a transmittance to actinic radiation of less than 20%, and wherein the reinforcing particles are selected from the group consisting of graphene, carbon nanotubes, and combinations thereof.

In accordance with another aspect of this invention there is provided a method for preparing a printing form from a photosensitive element comprising a layer of a photosensitive composition comprising a binder, a monomer, and a Norrish type II photoinitiator, wherein the photosensitive layer contains reinforcing particles that provide the layer with a transmittance to actinic radiation of less than 20%, and wherein the reinforcing particles are selected from the group consisting of graphene, carbon nanotubes, and combinations thereof. The method includes exposing the photosensitive element to actinic radiation; and treating the exposed photosensitive element to form a printing form having a surface suitable for printing.

DETAILED DESCRIPTION OF THE PREFERRED EMBODIMENTS(S)

The present invention provides a photosensitive element and a method of preparing a printing form from the photosensitive element. The photosensitive element can be used as a printing form for relief printing, e.g., flexographic and letterpress, from raised surfaces of the relief; or as a gravure-like printing form for gravure printing from recessed surfaces (or wells) of the relief. The photosensitive element is a photopolymerizable element formed of a layer of a photosensitive composition that includes a binder, at least one monomer, a photoinitiator, and reinforcing particles. In particular, the photosensitive element has at least one photosensitive layer that includes with the binder and the at least one monomer, reinforcing particles that provide the layer with a transmittance to actinic radiation of less than about 20%, in some instances less than 15%, and in other instances less than 10%, and the photoinitiator which is a Norrish type II photoinitiator.

The photosensitive printing element of the present invention has several advantages. The presence of the reinforcing particles in combination with the Norrish type II photoinitiator in the photopolymerizable layer provides improvement in the mechanical properties of the photosensitive element for use in both relief printing and gravure-like printing applications. The photosensitive printing element can withstand the rigorous conditions of associated with treatment to form a relief surface suitable for high quality printing of fine features such as lines and highlight dots of the resulting printing form. Also the photosensitive printing element can resist wear of the printing relief surface and dot chipping of relief elements in the relief surface. The presence of the reinforcing agent in the photopolymerizable layer can improve the productivity of a method to prepare a printing form from the photosensitive element by enhancing the efficacy of engraving, or removal in depth, of cured material from the photopolymerizable layer. The presence of the reinforcing particles in the photopolymerizable layer can also provide an improvement in the solvent resistance of the photosensitive element for use in both relief printing and gravure-like printing applications. Surprisingly, the solvent resistance of the photosensitive element is markedly increased by a photopolymerizable layer containing reinforcing agents selected from the group consisting of graphene, carbon nanotubes, and combinations thereof. The presence of the Norrish type II photoinitiator permits effective initiation and penetration of the actinic radiation, e.g. ultraviolet radiation, required to photochemically reinforce the element despite the presence of the reinforcing particles that reduce the transmission of the radiation to less than less than about 20%, in some instances less than 15%, and in other instances less than 10%. The Norrish type II photoinitiator with a co-initiator is particularly effective at initiating the photopolymerization of the present photosensitive element. The use of a ketosulphone compound as the Norrish type II photoinitiator is a particularly effective initiator for the present photosensitive element.

The photosensitive printing element includes at least one layer of a photosensitive composition that can be considered a photopolymerizable composition. As used herein, the term "photopolymerizable" is intended to encompass systems that are photopolymerizable, photocrosslinkable, or both. In cases where the composition layer comprises more than one photopolymerizable layer on the substrate, the composition of each of the photopolymerizable layers can be the same or different from any of the other photopolymerizable layers. The photopolymerizable layer is a solid layer composed of the binder, a monomer, a photoinitiator, and reinforcing particles. In one embodiment, the layer is elastomeric. The photoinitiator has sensitivity to actinic radiation. Throughout this specification actinic radiation will include ultraviolet radiation and/or visible light. In one embodiment, the solid layer of the photopolymerizable composition can be imagewise exposed and treated with one or more solutions and/or heat to form a relief suitable for printing. In another embodiment, the solid layer of the photopolymerizable composition is reinforced photochemically by overall exposure to actinic radiation and mechanically reinforced by the reinforcing agents, and then engraved by exposure to laser radiation to selectively remove material to form a surface suitable for printing. As used herein, the term "solid" refers to the physical state of the layer that has a definite volume and shape and resists forces that tend to alter its volume or shape. The layer of the photopolymerizable composition is solid at room temperature, which is a temperature between about 5° C. and about 30° C. A solid layer of the photopolymerizable composition may be polymerized (photohardened), or unpolymerized, or both.

Unless otherwise indicated, the terms "photosensitive element" and "printing form" encompass elements or structures in any form suitable for printing, including, but not limited to, flat sheets, plates, seamless continuous forms, cylindrical forms, plates-on-sleeves, and plates-on-carriers. It is contemplated that printing form resulting from the photosensitive element has end-use printing applications for relief printing, such as flexographic and letterpress printing, and for gravure-like printing. Various processes may be used to produce a printing form from the photosensitive element and create a relief structure suitable for relief or gravure-like printing.

The photosensitive composition forming the layer is composed of a binder, a monomer, a photoinitiator, and reinforcing particles. The binder may be photoactive itself or may act as a matrix for one or more of the photoactive components, i.e., the monomer and the photoinitiator. The binder is a dispersible polymeric component that imparts desired physical and chemical characteristics to the exposed and unexposed photosensitive composition. The polymer is typically, but not necessarily, preformed. The polymer is not limited and includes polymers that are linear, branched, radial, comb, and can become interpenetrating networks.

The binder can be a preformed polymer that serves as a matrix for the monomer and photoinitiator system prior to exposure and is a contributor to the physical properties of the photopolymer both before and after exposure. Addition of the binder can allow the imaging element to be manufactured and handled as a dry film. As is the case with photoinitiators and monomers, the selection criteria for binders vary with the application. Molecular weight, glass transition temperature, flexibility, chemical resistance, solubility, toughness, and tensile strength, as well as cost and availability are among the factors that govern binder selection. The binder should be of sufficient molecular weight and have sufficiently high glass transition temperature that a film is formed when the composition is coated. Suitable binders can have widely varying molecular weights, from as low as 25,000 to greater than 300,000, to as much as 1,200,000 have been described. Unless otherwise indicated the molecular weight of the polymeric binder is a mean molecular weight Mw determined with the aid of gel permeation chromatography using polystyrene standards.

The binder can be a single polymer or mixture of polymers. The binder can include a combination of materials, which under appropriate preparation or end-use conditions, provide the resulting element with characteristics suitable for use as a printing form. The binder can be thermoplastic, elastomeric thermoplastic, elastomeric, or non-elastomeric. When a layer containing a thermoplastic elastomeric binder is reinforced photochemically, the layer remains elastomeric but is no longer thermoplastic after such reinforcement. Any of the following binders can be used alone or in combination to provide the photosensitive element with desired adhesion, flexibility, hardness, oxygen permeability, moisture sensitivity and other mechanical or chemical properties required for its processing or end use. Other components in the composition should be compatible with the binder to the extent that a clear, non-cloudy photosensitive layer is produced. The binder is present in the photosensitive composition from 10 to 95%, preferably 40-80%, and most preferably 45-65%, by weight, based on the weight of the composition.

Polymers suitable for use as the binder include elastomeric polymers of natural or synthetic polymers of conjugated diolefin hydrocarbons, such as, isoprene or butadiene. Examples of suitable elastomeric binders include, but is not limited to, natural rubber, polybutadiene, polyisoprene, copolymers of styrene and butadiene, nitrile-butadiene rubber, acrylonitrile-butadiene rubber, acrylonitrile-butadiene-styrene copolymers, methacrylate-acrylonitrile-butadiene-styrene copolymers, butyl rubber, copolymers of styrene and isoprene, polynorbonene rubber, and ethylene-propylene-diene rubber (EPDM). Also suitable as the binder are ethylene-propylene, ethylene-acrylate ethylene-vinyl acetate or acrylate rubbers. Block copolymers of vinyl-substituted aromatic hydrocarbons and conjugated dienes are also suitable for use as the binder. Further examples of elastomeric binders include, polyalkyleneoxides; polyphosphazenes; elastomeric polymers and copolymers of acrylates and methacrylate; elastomeric polyurethanes and polyesters; elastomeric polymers and copolymers of olefins such as ethylene-propylene copolymers and non-crosslinked EPDM; elastomeric copolymers of vinyl acetate and its partially hydrogenated derivatives. The polymers may be used alone or in combination with the AB block copolymers described herein. Additional examples of elastomeric materials suitable for use as the binder are described in *Plastic Technology Handbook*, Chandler et al., Ed., (1987).

Polymers that are curable by means other than photochemical reaction, such as thermally curable and room temperature curable silicone rubbers, can be included to the extent that these polymers can be effectively combined with the primary photochemically curable system.

Still further examples of other suitable binders alone or in combination include: polyacrylate and alpha-alkyl polyacrylate esters, e.g., polymethyl methacrylate and polyethyl methacrylate; polyvinyl esters, e.g., polyvinyl acetate, polyvinyl acetate/acrylate, polyvinyl acetate/methacrylate and hydrolyzed polyvinyl acetate; ethylene/vinyl acetate copolymers; polystyrene polymers and copolymers, e.g., with maleic anhydride and esters; vinylidene chloride copolymers, e.g., vinylidene chloride/acrylonitrile; vinylidene chloride/methacrylate and vinylidene chloride/vinyl acetate copolymers; polyvinyl chloride and copolymers, e.g., polyvinyl chloride/vinyl acetate); polyvinyl pyrrolidone and copolymers, e.g., polyvinyl pyrrolidone/vinyl acetate) saturated and unsaturated polyurethanes; high molecular weight polyethylene oxides of polyglycols having average molecular weights from about 4,000 to 1,000,000; epoxides, copolyesters, e.g., those prepared from the reaction product of a polymethylene glycol of the formula $HO(CH_2)_nOH$, where n is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acid; nylons or polyamides, e.g., N-methoxymethyl polyhexamethylene adipamide; polyvinyl alcohols; cellulose and cellulose derivatives, such as, cellulose esters, e.g., cellulose acetate, cellulose acetate succinate and cellulose acetate butyrate, and cellulose ethers, e.g., methyl cellulose, ethyl cellulose and benzyl cellulose; polycarbonates; polyvinyl acetal, e.g., polyvinyl butyral, polyvinyl formal; and polyformaldehydes.

The binder can be soluble, swellable, or dispersible in aqueous semi-aqueous, water, or organic solvent washout solutions. Binders which can be removed by treating in aqueous or semi-aqueous developers have been disclosed by Proskow, in U.S. Pat. No. 4,177,074; Proskow in U.S. Pat. No. 4,431,723; Worns in U.S. Pat. No. 4,517,279; Suzuki et al, in U.S. Pat. No. 5,679,485 and U.S. Pat. No. 5,830,621; and Sakurai et al. in U.S. Pat. No. 5,863,704. The block copolymers discussed in Chen, U.S. Pat. No. 4,323,636; Heinz et al., U.S. Pat. No. 4,430,417; and Toda et al., U.S. Pat. No. 4,045,231 can be treated by wash out in organic solvent solutions. Generally, the binders that are suitable for washout development are also suitable for thermal treatment wherein the unpolymerized areas of the photopolymerizable layer soften, melt, or flow upon heating. In the case where aqueous development of the photosensitive composition is desirable, the branched polymer product and/or the binder should contain sufficient acidic or other groups to render the composition processable in aqueous developer. Useful aqueous-processible binders include those disclosed in U.S. Pat. Nos. 3,458,311; 4,273,857; 6,210,854; 5,679,485; 6,025,098; 5,830,621; 5,863,704; and 5,889,116. Useful amphoteric polymers include interpolymers derived from N-alkylacryl-amides or methacrylamides, acidic film-forming comonomer and an alkyl or hydroxyalkyl acrylate such as those disclosed in U.S. Pat. No. 4,293,635.

In one embodiment, the binder is a thermoplastic elastomeric block copolymer composed of non-elastomeric blocks and elastomeric blocks, where A represents a non-elastomeric block of a vinyl-substituted aromatic hydrocarbons, and B represents an elastomeric block of conjugated dienes. Styrene and methylstyrene are examples of suitable vinyl-substituted aromatic hydrocarbons. Polybutadiene and polyisoprene are examples of conjugated dienes, which may be 1,2- or 1,4-linked. The block copolymers can be linear block copolymers, radial block copolymers, star block-copolymers, or quasi-radial block copolymers. The block copolymer may be fully or partially hydrogenated. The binder of the block copolymer can include tri-block A-B-A copolymers, but can also be two block copolymers of the A-B type, or those comprising a plurality of alternating elastomeric and thermoplastic blocks, for example A-B-A-B-A. Block copolymers are described in U.S. Pat. Nos. 4,323,636, 4,430,417, and 4,045,231. Particularly suitable thermoplastic elastomeric tri-block copolymers include poly(styrene/isoprene/styrene) (SIS) block copolymers, poly(styrene/butadiene/styrene) (SBS) block copolymers, and combinations of SIS and SBS block copolymers. It is also possible to employ mixtures of two or more different block copolymers. For example, ABA block copolymers can contain AB diblock copolymer. Also included as block copolymers such as, for example, polystyrene-poly(ethylenebutylene)-polystyrene (SEBS) block copolymer, and polystyrene-poly(ethylene-ethylene propylene)-polystyrene (SEEPS) block copolymer, The non-elastomer to elastomer ratio is preferably in the range of from 10:90 to 35:65. The block copolymer as binder may be present in an amount of 40% to 95% by weight of the photosensitive layer. In some embodiments, it may be desirable for the binder to include pendant alkyl groups of 1 to 6 carbon atoms, such as for example, methyl, ethyl, and tert-butyl, sufficient for donating hydrogen upon reaction with the Norrish type II photoinitiator. For example, ABA block copolymers may include vinyl group/s that are pendant) in the midblock, i.e., conjugated diene, which are available for hydrogen donation and can react with the Norrish type II photoinitiator.

One embodiment of a suitable multi-component system includes an elastomeric polyurethane composition. An example of a suitable polyurethane elastomer is the reaction product of (i) an organic diisocyanate, (ii) at least one chain extending agent having at least two free hydrogen groups capable of polymerizing with isocyanate groups and having at least one ethylenically unsaturated addition polymerizable group per molecule, and (iii) an organic polyol with a minimum molecular weight of 500 and at least two free hydrogen containing groups capable of polymerizing with isocyanate groups. For a description of some of these materials see U.S. Pat. Nos. 5,015,556 and 5,175,072.

In another embodiment, the binder encompasses core shell microgels and blends of microgels and preformed macromolecular polymers, such as those disclosed in Fryd et al., U.S. Pat. No. 4,956,252 and Quinn et al., U.S. Pat. No. 5,707,773.

Monomers that can be used in the composition activated by actinic radiation are well known in the art, and include, but are not limited to, addition-polymerization ethylenically unsaturated compounds having relatively low molecular weights that is, molecular weights generally less than about 30,000, and preferably less than about 5000. Unless described otherwise in the specification, the molecular weight is the weighted average molecular weight. The addition polymerization compound may also be an oligomer, and can be a single or a mixture of oligomers. If a polyacrylol oligomer is used, the oligomer should preferably have a molecular weight greater than 1000. The composition can contain a single monomer or a combination of monomers. The monomer compound capable of addition polymerization is present in at least an amount of 5%, preferably 10 to 20%, by weight of the composition.

Suitable monomers include, but are not limited to, acrylate monoesters of alcohols and polyols; acrylate polyesters of alcohols and polyols; methacrylate monoesters of alcohols and polyols; and methacrylate polyesters of alcohols and polyols; where the alcohols and the polyols suitable include alkanols, alkylene glycols, trimethylol propane, ethoxylated trimethylol propane, pentaerythritol, and polyacrylol oligomers. Other suitable monomers include acrylate derivatives and methacrylate derivatives of isocyanates, esters, epoxides, and the like. A combination of monofunctional and multifunctional acrylates or methacrylates may be used.

Examples of suitable monomers include the following: t-butyl acrylate, hexanediol diacrylate, hexanediol dimethyacrylate, 1,5-pentanediol diacrylate, N,N-diethylaminoethyl acrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol dimethacrylate, 1,4-cyclohexanediol diacrylate, 2,2-dimethylolpropane diacrylate, glycerol diacrylate, tripropylene glycol diacrylate, glycerol triacrylate, trimethylolpropane triacrylate, pentaerythritol triacrylate, polyoxyethylated trimethylolpropane triacrylate and trimethacrylate and similar compounds as disclosed in U.S. Pat. No. 3,380,831, 2,2-di(p-hydroxyphenyl)-propane diacrylate, pentaerythritol tetraacrylate, 2,2-di-(p-hydroxyphenyl)-propane dimethacrylate, triethylene glycol diacrylate, polyoxyethyl-2,2-di-(p-hydroxyphenyl)-propane dimethacrylate, di-(3-methacryloxy-2-hydroxypropyl)ether of bisphenol-A, di-(2-methacryloxyethyl) ether of bisphenol-A, di-(3-acryloxy-2-hydroxypropyl) ether of bisphenol-A, di-(2-acryloxyethyl) ether of bisphenol-A, di-(3-methacryloxy-2-hydroxypropyl) ether of tetrachloro-bisphenol-A, di-(2-methacryloxyethyl) ether of tetrachloro-bisphenol-A, di-(3-methacryloxy-2-hydroxypropyl) ether of tetrabromo-bisphenol-A, di-(2-methacryloxyethyl) ether of tetrabromo-bisphenol-A, di-(3-methacryloxy-2-hydroxypropyl) ether of 1,4-butanediol, di-(3-methacryloxy-2-hydroxypropyl) ether of diphenolic acid, triethylene glycol dimethacrylate, polyoxypropyl one trimethylol propane triacrylate (462), ethylene glycol dimethacrylate, butylene glycol dimethacrylate, propanediol dimethacrylate, 1,2,4-butanetriol trimethacrylate, 2,2,4-trimethyl-1,3-pentanediol dimethacrylate, pentaerythritol trimethacrylate, phenyl ethylene-1,2-dimethacrylate, pentaerythritol tetramethacrylate, trimethylol propane trimethacrylate, 1,5-pentanediol dimethacrylate, diallyl fumarate, 1,4-benzenediol dimethacrylate, 1,4-diisopropenyl benzene, and 1,3,5-triisopropenyl benzene.

Other examples of suitable monomers include acrylate and methacrylate derivatives of isocyanates, esters, epoxides and the like. In some end-use printing forms it may be desirable to use monomer that provide elastomeric properties to the element. Examples of elastomeric monomers include, but are not limited to, acrylated liquid polyisoprenes, acrylated liquid butadienes, liquid polyisoprenes with high vinyl content, and liquid polybutadienes with high vinyl content, (that is, content of 1-2 vinyl groups is greater than about 20% by weight).

Another class of monomers include an alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,024, e.g., those having a plurality of addition polymerizable ethylenic linkages particularly when present as terminal linkages. This class of monomers wherein at least one and preferably most of such linkages are conjugated with a double bonded carbon, including carbon double bonded to carbon and to such heteroatoms as nitrogen, oxygen and sulfur, are suitable in some embodiments. Also suitable are such monomeric materials wherein the ethylenically unsaturated groups, especially the vinylidene groups, are conjugated with ester or amide structures.

Further examples of monomers can be found in Chen U.S. Pat. No. 4,323,636; Fryd et al., U.S. Pat. No. 4,753,865; Fryd et al., U.S. Pat. No. 4,726,877 and Feinberg et al., U.S. Pat. No. 4,894,315.

The photoinitiator can be any single compound or combination of compounds that is sensitive to actinic radiation to form a species that will initiate either free radical crosslinking and/or polymerization reactions. The photoinitiator for the main or overall exposure (as well as an optional post-exposure and backflash) is sensitive to visible or ultraviolet radiation, between 310 to 400 nm, and preferably 345 to 365 nm. A photoinitiator or photoinitiator system that generates free radicals based on photoinduced hydrogen abstraction mechanism is particularly suitable for use in the present invention. These photoinitiators are particularly effective at capturing the actinic radiation impinging the photosensitive layer and initiating polymerization in the exposed portions of the layer to allow for complete or substantially complete photochemical reinforcement to occur. Photoinitiators based on hydrogen abstraction may also be referred to a Norrish type II photoinitiators. Electrically excited carbonyl compounds are hydrogen abstractors that are considered Norrish type II photoinitiators. In one embodiment of the hydrogen abstraction mechanism, the excited state of the carbonyl compound abstracts a hydrogen from an appropriate substrate or hydrogen donor compound, known as a coinitiator, to form a ketyl radical (derived from the carbonyl compound) and a radical derived from the coinitiator. The coinitiator radical can either initiate polymerization or abstract a hydrogen atom from another substrate to produce a secondary radical that initiates polymerization. Carbonyl compounds suitable as the Norrish type II photoinitiator include aromatic ketones and quinones, such as, for example, benzophenones, ketosulphones, thioxanthenes, 1,2-diketones, anthraquinone, fluorenones, xanthones, acetophenone derivatives, benzoin ethers, benzl ketals, phenylglyoxylates, mono- and bis-acylphosphine. Suitable coinitiators include thiols, aldehydes, secondary alcohols, primary amines, secondary amines, and tertiary amines. One embodiment of a suitable coinitiator is an aromatic-amine disclosed in formula I by Romagnano et al. in WO 2007/017298, which is hereby incorporated by reference. Examples of suitable Norrish type II photoinitiator systems composed of the Norrish type II photoinitiator and coinitiator include, but are not limited to, anthraquinone and a hydrogen donor; benzophenone and tertiary amines; Michler's ketone alone and with benzophenone; thioxanthenes and a coinitiator; and 3-ketocourmarins and a coinitiator. One embodiment of a suitable photoinduced hydrogen abstraction photoinitiator and coinitiator system is disclosed by Romagnano et al. in WO 2007/017298, which is hereby incorporated in its entirety by reference. The Norrish type II photoinitiator is present in the photosensitive composition in an amount of 0.1 to 15% by weight, based on the weight of the photosensitive composition. In one embodiment, the coinitiator may be present in the photosensitive composition in an amount of 0.1 to 15% by weight, based on the weight of the photosensitive composition. In another embodiment, the coinitiator need not be present. In an embodiment in which the binder includes sufficient pendant alkyl groups of 1 to 6 carbon atoms, such as for example, methyl, ethyl, and tert-butyl, the binder can assist with the coinitiator or act as the coinitiator in donating hydrogen upon reaction with the Norrish type II photoinitiator.

While the Norrish type II photoinitiators will drive the bulk of the photopolymerization reaction for the photosensitive element, the following optional photoinitiators may also aid in photohardening the element. Optionally, the photosensitive composition may include a second photoinitiator or photoinitiator system that generates free radicals based on photofragmentation mechanism, which may be referred to as Norrish type I photoinitiators. Suitable initiators for photofragmentation mechanism include, but are not limited to, peroxides, azo compounds, benzoin derivatives, derivatives of acetophenone, ketoxime esters of benzoin, triazines, and biimidazoles. As is known to those skilled in the art, acetophenone derivatives can be at the core of Norrish type I and Norrish type II photoinitiator reactions.

Optionally, a second photoinitiator sensitive to radiation between 220 to 300 nm, preferably 245 to 265 nm, may optionally be present in the photosensitive composition. After treating or engraving, a plate can be finished with radiation between 220 to 300 nm to detackify the relief surfaces. The second photoinitiator decreases the finishing exposure time necessary to detackify the plate. The second photoinitiator can be effective in photosensitive elements having transmission to actinic radiation of less than 20% since the detackifying reaction occurs at an exterior surface (i.e., contact surface) of the printing form. These optional photoinitiators may be independently present in amounts from 0.001% to 10.0% based on the weight of the photopolymerizable composition.

The photosensitive composition includes reinforcing particles that enhance the mechanical strength of the printing element. The mechanical strength of the element can be enhanced for the purpose of laser engraving and/or for end-use purposes to withstand the rigors of certain printing applications associated with the use of materials such as inks or substrates, or processes for printing. The presence of the reinforcing particles in the photosensitive layer can also enhance the solvent resistance of the printing element. Reinforcing particles of graphene and/or carbon nanotubes in the photosensitive layer surprisingly provide a barrier to solvent action, and significantly improve resistance to swelling by solvents and even potent solvents in the photosensitive element and in the resulting printing form. Reinforcing particles may also be referred to herein as reinforcing particulate and reinforcing agents.

The photosensitive composition includes reinforcing particles that are selected from the group consisting of graphene, carbon nanotubes, and combinations thereof. Graphene is a single planar sheet of $sp^2$-boned carbon atoms that is densely packed into a benzene-ring structure and considered an aromatic. Graphenes are two dimensional counterparts of three dimensional graphite. Carbon nanotubes are considered graphene sheets rolled up into nanometer-sized cylinders. The reinforcing particles of graphene and/or carbon nanotubes should be suitably dispersed within the layer formed from the photosensitive composition, which can be accomplished with the aid of a dispersing agent. The graphenes and/or carbon nanotubes have a particle size which can range from about 100 nm to about 10 micron. In other embodiments, the particle size can range from about 100 nm to about 5000 nm. In some embodiments, the particle size of graphenes can range from about 200 nm to about 7 to 10 micron in length. In some embodiments, the particle size of carbon nanotubes can range from about 300 to 800 nm in length.

Optionally, the graphene and/or carbon nanotubes can be incorporated with a component that allows for dispersing of the particles in the composition and uniform distribution of the particles in the photosensitive layer of the element. The layer containing the graphene and/or carbon nanotubes can be prepared by conventional methods by combining the particles with the one or more components. Generally it is not suitable to combine the graphene and/or carbon nanotubes that is in particulate form in a liquid-like component due to the difficulty in dispersing the graphene and/or carbon nanotubes in solution. Since the graphene and/or carbon nanotubes are in particulate form, a dispersant can be added in order to disperse the graphene and/or carbon nanotubes particles and avoid flocculation and agglomeration. Dispersants suitable for use are not limited, provided that the dispersant can uniformly distribute the reinforcing particles in the layer, and is sufficiently compatible with the binder and other components in the photosensitive layer to the extent that a clear, non-cloudy photosensitive layer is produced. A wide range of dispersants are commercially available. One embodiment of suitable dispersants are the A-B dispersants generally described in "Use of A-B Block Polymers as Dispersants For Non-aqueous Coating Systems" by H. K. Jakubauskas, *Journal of Coating Technology*, Vol. 58; Number 736; pages 71-82. Useful A-B dispersants are disclosed in U.S. Pat. Nos. 3,684,771; 3,788,996; 4,070,388; and 4,032,698. The dispersant is generally present in an amount of about 0.1 to 10% by weight, based on the total weight of the photosensitive composition. In another embodiment, the graphene and/or carbon nanotubes is incorporated with a polymeric binder. The graphene and/or carbon nanotubes can be combined with a polymeric binder which can be selected from the binders described as suitable for use in the photosensitive layer and the additional layers, and which can be the same or different from the binder used in the photosensitive layer and/or the additional layers. A preferred method for preparing the composition containing the graphene and/or carbon nanotubes is to precompound the graphene and/or carbon nanotubes with a portion of the total amount of binder, and then add the remaining portion of the binder to the precompounded mixture. Adding of the precompounding mixture to the remaining portion of the binder encompasses diluting, mixing, and/or blending. At any point in the precompounding, a solvent can be used for dispersing the materials used in the diluting, mixing, and/or blending steps. The weight ratio of the precompounded mixture to the remaining binder portion in some embodiments can be 1:10000 to 1:100, and in other embodiments can be 1:1000 to 1:10. This is done to ensure that the graphene and/or carbon nanotubes is well dispersed in the binder and uniformly distributed in the layer.

The reinforcing particles of graphene and carbon nanotubes are dark, that is, the particles by themselves or in combination with the photosensitive composition are devoid or partially devoid of light and do not or only partially receive, reflect, or transmit light. The presence of the reinforcing particles of graphene and/or carbon nanotubes provide the photosensitive layer with a transmittance to actinic radiation of less than 20%, and in some embodiments of less than 10%. The presence of the graphene and/or carbon nanotubes as reinforcing particles provide the photosensitive layer with a transmittance to actinic radiation of less than 10% in some embodiments, less than 5% in other embodiments, and less than 1% in yet other embodiments. The reinforcing particles of graphene and/or carbon nanotubes are present in the photosensitive layer in an amount greater than 0.4% by weight in some embodiments, greater than 0.8% by weight in other embodiments, and greater than 1% by weight in yet other embodiments, based on the weight of the photosensitive composition. In some embodiments, the reinforcing particles of graphene and/or carbon nanotubes are present in amounts from 1 to 5% by weight of the composition.

Optionally, the photosensitive composition may also include, with the graphene and/or carbon nanotubes, additional reinforcing particles. Any type of additional reinforcing particles can be employed in the present invention, provided that the particles can be suitably dispersed within the layer formed from the photosensitive composition. Optionally, the additional reinforcing particles can also be incorporated into the photosensitive composition with the aid of a dispersing agent as described above. The reinforcing particulate can be organic, inorganic, mixtures of organic and inorganic compounds, or multicomponent. The reinforcing particulate can include additives. The reinforcing particles are preferably a fine powder having a wide range of particle sizes.

For additional reinforcing particles that are dark, the presence of the reinforcing particles in the photosensitive layer at as little as 0.4% by weight can render the photosensitive layer opaque enough to prevent or significantly reduce (to less than 10%, and in some embodiments to less than 20%) the penetration of actinic radiation, i.e., ultraviolet radiation, necessary for photochemical reinforcement of the layer. The photosensitive layer may have less than 10% transmittance at higher loading (e.g., greater than 0.4% by weight in some embodiments, greater than 1% by weight in other embodiments, and greater than 10% by weight for yet other embodiments) of the additional reinforcing particles that are not dark in the photosensitive layer. The additional reinforcing particles are present in the photosensitive layer in an amount greater than 0.4% by weight in some embodiments, greater than 0.8% by weight in other embodiments, and greater than 1% by weight in yet other embodiments, based on the weight of the photosensitive composition. In some embodiments, the additional reinforcing particles are present in amounts from 1 to 5% by weight, 5 to 20% by weight, and from 1 to about 25% by weight of the composition.

The engraving sensitivity of the photosensitive layer is increased by the presence of the reinforcing particles which is sensitive to the wavelength of laser radiation used for engraving, which in some embodiments is 9 and 12 micrometers. In one embodiment, the sensitivity of the reinforcing particles is matched to the wavelength of laser radiation used for engraving which is typically a $CO_2$ laser. In some embodiments, the reinforcing particles absorb infrared radiation at 9 to 12 micrometers. Increased engraving sensitivity of the elastomeric layer results in increasing the speed of engraving (compared to elastomeric materials without reinforcing particles) and reducing the tackiness of the debris generated by engraving. The additive can also enhance the mechanical properties of the elastomeric layer, such as tensile strength, stiffness, tear resistance, and abrasion resistance.

Increasing the amount of reinforcing particles causes a concomitant improvement in the laser engravability and the mechanical properties of the photosensitive element (and printing form) until a maximum is reached which represents the optimum loading for a particular composition. Beyond this point, the properties of the photosensitive layer will deteriorate. The effectiveness of the reinforcing particles also depends on the particle size and the tendency of the material to agglomerate or form chains. In general, tensile strength, abrasion and tear resistance, hardness, and toughness increase with decreasing particle size.

The effectiveness of the reinforcing particles also depends on the particle size and the tendency of the material to agglomerate or form chains. In general, tensile strength, abrasion and tear resistance, hardness, and toughness increase with decreasing particle size. Carbon black having particle size of 200 to 500 angstroms in diameter is suitable. For other additional reinforcing particles, particle sizes up to a few micrometers in diameter can be used. In some embodiments, the particles are less than 1 micrometer. Reinforcing particles that are nanometer ($10^{-9}$) sized particles offer a particular advantage over conventional micron sized reinforcing particles in that the nanometer particles are so small that they do not reduce the penetration or scatter the actinic radiation that exposes the element, and thereby may provide the capability for incorporating higher loading levels of the reinforcing particles into the photosensitive layer.

Examples of materials suitable for the additional reinforcing particles include, but are not limited to, carbon black, graphite, and furnace black. Other examples of additional reinforcing particles include, but are not limited to, $TiO_2$, calcium carbonate, calcium silicate, barium sulfate, mica, zinc oxide, magnesium oxide, titanium oxide, aluminum, and alumina. Additional reinforcing particles also encompass materials having silica-oxygen (Si—O bond) functionality or phosphorus-oxygen (P—O bond) functionality. Suitable materials with silica-oxygen single-bond functionality include particulate inorganic filler materials such as silicas, clays, talcs, mica, and silicates, for example, calcium silicate and zirconium silicate. Suitable materials containing phosphorous-oxygen single bond functionality include particulates such as aromatic phosphates, aromatic phosphites and aromatic phosphonates.

Other examples of additional reinforcing particles includes particles having color such as pigment particles, toner particles, mixtures of pigment particles, mixtures of toner particles and mixtures of pigment and toner particles. Pigment particles as reinforcing particles can be in crystallite form or may be aggregates. Pigment particles suitable for use can be any provided the pigment provides the desired characteristics to the photosensitive element such as an increase in mechanical reinforcement. Some suitable additional reinforcing particles include dark blue pigments, and dark brown pigments. Further examples of pigment particles include, but are not limited to. Toluidine Red (C.I. Pigment Red 3), Toluidine Yellow (C.I. Pigment Yellow 1), copper phthalocyanine crystals, quinacridone crystals, Toluidine Red YW, Watchung Red BW (C.I. Pigment Red 48), Toluidine Yellow GW (C.I. Pigment Yellow 1), Monastral Blue BW (C.E. Pigment Blue 15), Monastral Green BW (C.I. Pigment Green 7), Pigment Scarlet (al. Pigment Red 60), Auric Brown (C.I. Pigment Brown 6), Monastral Green (Pigment Green 7) and Monastral Maroon B and Monastral Orange. Also suitable as pigment particles are copper chromite, chromium oxides and cobalt chrome aluminate; and metals such as aluminum, copper or zinc, and alloys of bismuth, indium, and copper.

Toner particles are pigmented organic resin particles which comprise pigment particles finely dispersed in a resin matrix which is then ground to the desired particle size. Pigmented organic resin particles are described in Chu and Manger in U.S. Pat. No. 3,620,726; Vesce in U.S. Pat. No. 2,649,382; and Gray in U.S. Pat. No. 3,909,282 which are hereby incorporated by reference. Pigments suitable for use in the toner particles can be any including those mentioned above, provided the toner provides the desired opacity to the particles as well as other desired characteristics. Suitable resin matrices include, but not limited to, polyvinyl chloride, cellulose acetate, cellulose acetate butyrate, polystyrene, polymethyl methacrylate. Also useful are water soluble polymer matrices, for example, polyvinyl alcohol, methyl cellulose, carboxymethyl cellulose. The particular matrix being used depending on the mechanical means of processing the toner down to the desired effective particle size, desired opacity, and desired ablation sensitivity. Toners suitable for use as the powder layer are not limited and can include toners used for pre-press proofing systems as well as electroconductive toners used in xerographic copy systems. Particularly preferred toners are black toners sold by DuPont as Cromalin® black toners, e.g., Cromalin®type KK6 black toner e.g. a carbon black and cellulose acetate blend.

In one embodiment, the photosensitive composition includes reinforcing particles selected from the group consisting of graphene, carbon nanotubes, and combinations thereof. In another embodiment, the photosensitive composition includes reinforcing particles selected from the group consisting of graphene, carbon nanotubes, and combinations thereof; and, one type of additional reinforcing particles. In other embodiments, the photosensitive composition includes reinforcing particles selected from the group consisting of graphene, carbon nanotubes, and combinations thereof; and, more than one type of additional reinforcing particles. Some embodiments of these reinforcing particles of graphene and/or carbon nanotubes alone can provide desired improvements in mechanical reinforcement and solvent resistance of the element, and render the layer sufficiently opaque (i.e., the layer having a transmittance to actinic radiation less than 10%, and in other embodiments having a transmittance to actinic radiation less than 20%) that the Norrish type II photoinitiator suitably drives the polymerization reaction for photochemical reinforcement. In other embodiments, these reinforcing particles of graphene and/or carbon nanotubes alone may provide desired improvements in mechanical reinforcement and solvent resistance of the element, but do not render the layer sufficiently opaque (i.e., the layer has a transmittance to actinic radiation greater than about 10%, and in some embodiments greater than 20%). In this case it may be desirable to include dyes or other materials to render the layer suitably opaque.

Additional additives to the photosensitive layer include plasticizers, colorants, dyes, processing aids, antioxidants, and antiozonants. Plasticizers, which may sometimes also include monomeric functionality, can include acrylated liquid polyisoprenes, acrylated liquid polybutadienes, liquid polyisoprenes with high vinyl content, and liquid polybutadienes with high vinyl content, (that is, content of 1-2 vinyl groups is greater than 20% by weight), Processing aids may be such things as low molecular weight polymers compatible with the binder. Antiozonants include hydrocarbon waxes, norbornenes, and vegetable oils. Suitable antioxidants include alkylated phenols, alkylated bisphenols, polymerized trimethyldihydroquinone, and dilauryl thiopropinoate.

The thickness of the solid photosensitive layer can vary over a wide range depending upon the type of printing form desired. In one embodiment, the photosensitive layer can have a thickness from about 0.015 inch to about 0.250 inch or greater (about 0.038 to about 0.64 cm or greater), and preferably about 0.020 to 0.155 inch (0.5 mm to 3.9 mm). In another embodiment, the photosensitive layer can have a thickness from about 0.002 inch to 0.025 inch (0.051 to 0.64 mm), and preferably 0.005 to 0.020 inch (0.13 to 0.5 mm).

The photosensitive element may optionally include a support adjacent the layer of the photosensitive composition. The support can be composed of any material or combination of materials that is conventionally used with photosensitive elements used to prepare printing forms. In some embodiments, the support is transparent to actinic radiation to accommodate "backflash" exposure through the support. Examples of suitable support materials include polymeric films such those formed by addition polymers and linear condensation polymers, transparent foams and fabrics, such as fiberglass. Under certain end-use conditions, metals such as aluminum, steel, and nickel, may also be used as a support, even though a metal support is not transparent to radiation. A preferred support is a polyester film; particularly preferred is polyethylene terephthalate film. The support may be in sheet form or in cylindrical form, such as a sleeve. The sleeve can be formed of any material or combination of materials conventionally used in forming sleeves for printing. The sleeve can have a single layer, multi-layer, composite, or unitary structure. Sleeves made of polymeric films are typically transparent to actinic radiation and thereby accommodate backflash exposure for building a floor in the cylindrical printing element. Multiple layered sleeves may include an adhesive layer or tape between the layers of flexible material, such as disclosed in U.S. Pat. No. 5,301,610. The sleeve may also be made of non-transparent, actinic radiation blocking materials, such as nickel or glass epoxy. The sleeve may be composed of one or more layers of a resin composition, which can be the same or different, and have fillers and/or fibers incorporated therein. Materials suitable as the resin composition are not limited, examples of which include, epoxy resins; polystyrene and polyvinyl resins, such as polyvinyl chloride and polyvinyl acetate; phenolic resins; and aromatic amine-cured epoxy resins. The fibers used in the resin composition are not limited and can include, for example, glass fibers, aramid fibers, carbon fibers, metal fibers, and ceramic fibers, Fibers incorporated with the sleeve can include continuous, woven, and/or wound materials. The support formed of a resin composition reinforced with fiber is an example of a composite sleeve. The support typically has a thickness from 0.002 to 0.050 inch (0.0051 to 0.127 cm). A preferred thickness for the sheet form support is 0.003 to 0.016 inch (0.0076 to 0.040 cm). The sleeve can have a wall thickness from about 0.01 and about 6.35 mm or more. In some embodiments, the sleeve has a wall thickness between about 0.25 and 0.80 mm. In some embodiments, the sleeve has a wall thickness between about 10 to 80 mils (0.25 to 2.0 mm), and in other embodiments 10 to 40 mils (0.25 to 1.0 mm). In yet other embodiments, the sleeve has a thickness between about 1 and 3 mm.

Optionally, the element can include an adhesive layer between the support and the photopolymerizable layer, or a surface of the support that is adjacent the photopolymerizable layer has an adhesion-promoting surface. The adhesive layer on the surface of the support can be a subbing layer of an adhesive material or primer or an anchor layer as disclosed in U.S. Pat. No. 2,760,863 to give strong adherence between the support and the photopolymerizable layer. The adhesive compositions disclosed in Burg, U.S. Pat. No. 3,036,913 are also effective. Alternatively, the surface of the support on which the photopolymerizable layer resides can be treated to promote adhesion between the support and the photopolymerizable layer, with flame-treatment or electron-treatment, e.g., corona-treated. Further, the adhesion of the photopolymerizable layer to the support can be adjusted by exposing the element to actinic radiation through the support as disclosed by Feinberg et al. in U.S. Pat. No. 5,292,617.

In one embodiment, the photosensitive element includes the support and a layer of the photosensitive composition on the support. The layer of the photosensitive composition is primarily reinforced by the inclusion of the reinforcing particles to enhance mechanical properties of the element and resultant printing form. The presence of the reinforcing particles can also enhance engraving efficiency of the element by laser radiation. The photosensitive layer is also reinforced photochemically by exposure to actinic radiation to affect photohardening in depth. The photosensitive layer includes a Norrish type II photoinitiator that is effective at capturing actinic radiation and initiating polymerization through the exposed portions of the particulate filled layer to allow for complete or substantially complete photochemical reinforcement. The composition layer is at least one layer on the substrate capable of being treated to form a relief suitable for printing. In the present invention, treating encompasses various methods of forming the relief printing surface from the photosensitive element including, application of one or more solutions and/or heat to an imagewise exposed photosensitive element to remove uncured (i.e., unpolymerized material) from the layer to form the relief printing surface; and, exposing the photosensitive element to actinic radiation to photochemically reinforce the element and exposing with laser radiation to selectively remove the reinforced material to form the relief printing surface. In one embodiment, the photosensitive element is an elastomeric printing element suitable for use as a flexographic printing form. In another embodiment, the photosensitive element can be transformed into a printing form for gravure-like printing.

The photosensitive element includes at least one photosensitive layer that contains the reinforcing particles that provide the layer with a transmittance to actinic radiation of less than 20% and are selected from the group consisting of graphene, carbon nanotubes, and combinations thereof. The photosensitive element can be a bi- or multi-layer construction, wherein the additional layer/s can be photosensitive (or can become photosensitive), or non-photosensitive. The additional layer/s can have the same, or substantially the same, or different composition as the photosensitive composition that contains the reinforcing particles. In some embodiments, the photosensitive element may include an intermediate layer between a support and a top layer of the photosensitive composition containing the reinforcing particles. In some embodiments, the intermediate layer may provide the photosensitive element with desired bulk properties for end-use as the printing form. For example in one embodiment of photosensitive elements for use as flexographic printing forms, the intermediate layer may be an elastomeric non-photosensitive layer that provides the printing form with desired Shore A hardness, resilience, and/or compressibility, and the top layer is the photosensitive layer containing the reinforcing particles. The one or more additional layers can undergo the same treatment steps, or can remain unaffected by the treatment steps, that the photosensitive layer containing the reinforcing particles undergoes.

The photosensitive element may include one or more additional layers on or adjacent the photosensitive layer. In most embodiments the one or more additional layers are on a side of the photosensitive layer opposite the support. Examples of additional layers include, but are not limited to, a release layer, a capping layer, an elastomeric layer, a barrier layer, and combinations thereof. The one or more additional layers can be removable, in whole or in part, during treatment. One or more of the additional layers may cover or only partially cover the photosensitive composition layer. An example of an additional layer which only partially covers the photosensitive composition layer is a masking layer that is formed by imagewise application, e.g., ink jet application, of an actinic radiation blocking material or ink.

The release layer protects the surface of the composition layer and enables the easy removal of a mask used for the imagewise exposure of the photosensitive element. Materials suitable as the release layer are well known in the art. Suitable compositions for the capping layer and methods for forming the layer on the element are disclosed as elastomeric compositions in a multilayer cover element described in Gruetzmacher at al., U.S. Pat. Nos. 4,427,759 and 4,460,675. The elastomeric capping layer is similar to the photosensitive layer in that after imagewise exposure the elastomeric capping layer is at least partially removable by treating. The elastomeric capping layer includes an elastomeric binder, which can be the same or different from the elastomeric binder described above, and optionally, one or more monomers, photoinitiator or photoinitiator system, and other additives as described for the photosensitive layer. The elastomeric layer or capping layer can be photosensitive itself, that is, contain monomer and initiator, or it can become photosensitive when in contact with the photopolymerizable layer. The composition of the elastomeric capping layer can be the same as, or substantially the same as, or different from the composition of the adjacent photopolymerizable layer. In some embodiments, the elastomeric layer includes with an elastomeric binder, a Norrish type II photoinitiator and reinforcing agents selected from the group consisting of graphene, carbon nanotubes, and combinations thereof. The elastomeric capping layer is solid that generally forms a monolithic structure with the adjacent photopolymerizable layer. The thickness of the elastomeric capping layer is typically between about 0.001 inch to about 0.010 inch (0.025 to 0.25 mm).

The photosensitive element of the present invention may further include a temporary coversheet on top of the uppermost layer of the photosensitive element. One purpose of the coversheet is to protect the uppermost layer of the photosensitive element during storage and handling. Depending upon end use, the coversheet may or may not be removed prior to imaging, but is removed prior to development. Suitable materials for the coversheet are well known in the art.

The photosensitive composition can be prepared by employing a variety of techniques that are well known in the art. One method which can be used is to mix the components (that is, binder, initiator, monomer with silica particles, and other ingredients) in an extruder and then extrude the mixture as a hot melt onto a support. It is preferred that the extruder be used to perform the functions of melting, mixing, deaerating, and filtering the composition. To achieve uniform thickness, the extrusion step can be advantageously coupled with a calendering step in which the hot mixture is calendered between two sheets or between one flat sheet and a release roll. Alternately, the material can be extruded/calendered onto a temporary support and later laminated to the desired final support. The elements can also be prepared by compounding the components in a suitable mixing device and then pressing the material into the desired shape in a suitable mold. The material is generally pressed between the support and the coversheet. The molding step can involve pressure and/or heat. The coversheet may include one or more of the additional layers which transfer to the photopolymerizable layer when the photosensitive element is formed.

In one embodiment, the photosensitive element is prepared for treatment by imagewise exposing the element to actinic radiation. After imagewise exposure, the photosensitive element contains cured portions in the exposed areas of the radiation curable composition layer and uncured portions in the unexposed areas of the radiation curable composition layer. Imagewise exposure is carried out by exposing the photosensitive element through an image-bearing mask. The image-bearing mask may be a black and white transparency or negative containing the subject matter to be printed, or an in-situ mask formed on the composition layer by means known in the art. Imagewise exposure can be carried out in a vacuum (frame) or may be conducted in the presence of atmospheric oxygen. On exposure, the transparent areas of the mask allow addition polymerization or crosslinking to take place, while the actinic radiation opaque areas remain uncrosslinked. Exposure is of sufficient duration to crosslink the exposed areas down to the support or to a back exposed layer (floor). Imagewise exposure time is typically much longer than backflash time, and ranges from a few to tens of minutes.

For direct-to-plate image formation as disclosed in U.S. Pat. No. 5,262,275; U.S. Pat. No. 5,719,009; U.S. Pat. No. 5,607,814; U.S. Pat. No. 5,506,086; U.S. Pat. No. 5,766,819; U.S. Pat. No. 5,840,463; U.S. Pat. No. 6,238,837; U.S. Pat. No. 6,558,876; and U.S. Pat. No. 6,773,859 the image-bearing mask is formed in-situ with the laser radiation sensitive layer using an infrared laser exposure engine. The imagewise laser exposure can be carried out using various types of infrared lasers, which emit in the range 750 to 20,000 nm, preferably in the range 780 to 2,000 nm. Diode lasers may be used, but Nd:YAG lasers emitting at 1060 nm are preferred. To the extent that the infrared laser exposure engine can be controlled or tuned such that the infrared sensitive layer can be removed from or transferred to the photosensitive layer without detrimental impact to the underlying photopolymerizable layer which is also dark, these systems are suitable.

It is also contemplated that in-situ digital mask formation can be accomplished by imagewise application of the radiation opaque material in the form of inkjet inks. Imagewise application of an ink-jet ink can be directly on the photopolymerizable layer or disposed above the photopolymerizable layer on another layer of the photosensitive element. Another contemplated method that digital mask formation can be accomplished is by creating the mask image of the radiation opaque layer on a separate carrier and then transferring with application of heat and/or pressure to the surface of the photopolymerizable layer opposite the support. The photopolymerizable layer is typically tacky and will retain the transferred image. The separate carrier can then be removed from the element prior to imagewise exposure. The separate carrier may have a radiation opaque layer that is imagewise exposed to laser radiation to selectively remove the radiation opaque material and form the image.

Actinic radiation sources encompass the ultraviolet, visible and infrared wavelength regions. The suitability of a particular actinic radiation source is governed by the photosensitivity of the initiator and the at least one monomer used in preparing the flexographic printing plates from the photosensitive element. The preferred photosensitivity of most common flexographic printing plates is in the UV and deep visible area of the spectrum, as they afford better room-light stability. The portions of the composition layer that are exposed to radiation chemically cross-link and cure. The portions of the composition layer that are unirradiated (unexposed) are not cured and have a lower melting or liquefying temperature than the cured irradiated portions. The imagewise exposed photosensitive element is then ready for treatment to remove unpolymerized areas in the photopolymerizable layer and thereby form a relief image areas of the image.

An overall back exposure through the support side, a so-called backflash exposure, may be conducted to polymerize a predetermined thickness of the photopolymer layer adjacent the support. The backflash exposure may be conducted before, after, or even during other imaging steps, the imagewise exposure. This polymerized portion of the photopolymer layer is designated a floor. The floor provides improved adhesion between the photopolymerizable layer and the support, helps highlight dot resolution and also establishes the depth of the plate relief. The floor thickness varies with the time of exposure, exposure source, etc. This exposure may be done diffuse or directed. All radiation sources suitable for imagewise exposure may be used. The exposure is generally for 10 seconds to 30 minutes.

Following overall exposure to UV radiation through the mask, the photosensitive printing element is treated to remove unpolymerized areas in the photopolymerizable layer and thereby form a relief image. The treating step removes at least the photopolymerizable layer in the areas which were not exposed to actinic radiation, i.e., the unexposed areas or uncured areas, of the photopolymerizable layer. Except for the elastomeric capping layer, typically the additional layers that may be present on the photopolymerizable layer are removed or substantially removed from the polymerized areas of the photopolymerizable layer. For photosensitive elements having an in-situ mask, the treating step also removes the mask image (which had been exposed to actinic radiation) and the underlying unexposed areas of the photopolymerizable layer.

In one embodiment, treatment of the photosensitive element includes (1) "wet" development wherein the photopolymerizable layer is contacted with a suitable developer solution to washout unpolymerized areas and (2) "dry" development wherein the photosensitive element is heated to a development temperature which causes the unpolymerized areas of the photopolymerizable layer to melt or soften or flow and then are removed. Dry development may also be called thermal development. It is also contemplated that combinations of wet and dry treatment can be used to form the relief.

Wet development is usually carried out at about room temperature. The developers can be organic solvents, aqueous or semi-aqueous solutions, and water. The choice of the developer will depend primarily on the chemical nature of the photopolymerizable material to be removed. Suitable organic solvent developers include aromatic or aliphatic hydrocarbon and aliphatic or aromatic halohydrocarbon solvents, or mixtures of such solvents with suitable alcohols. Other organic solvent developers have been disclosed in published German Application 38 28 551. Suitable semi-aqueous developers usually contain water and a water miscible organic solvent and an alkaline material. Suitable aqueous developers usually contain water and an alkaline material. Other suitable aqueous developer combinations are described in U.S. Pat. No. 3,796,602.

Development time can vary, but it is preferably in the range of about 2 to about 25 minutes. Developer can be applied in any convenient manner, including immersion, spraying and brush or roller application. Brushing aids can be used to remove the unpolymerized portions of the element. Washout can be carried out in an automatic processing unit which uses developer and mechanical brushing action to remove the uncured portions of the plate, leaving a relief constituting the exposed image and the floor.

Following treatment by developing in solution, the relief printing plates are generally blotted or wiped dry, and then more fully dried in a forced air or infrared oven. Drying times and temperatures may vary, however, typically the plate is dried for 60 to 120 minutes at 60° C. High temperatures are not recommended because the support can shrink and this can cause registration problems.

Treating the element thermally includes heating the photosensitive element having at least one photopolymerizable layer (and the additional layer/s) to a temperature sufficient to cause the uncured portions of the photopolymerizable layer to liquefy, i.e., soften or melt or flow, and removing the uncured portions. The layer of the photosensitive composition is capable of partially liquefying upon thermal development. That is, during thermal development the uncured composition must soften or melt at a reasonable processing or developing temperature. If the photosensitive element includes one or more additional layers on the photopolymerizable layer, it is preferred that the one or more additional layers are also removable in the range of acceptable developing temperatures for the photopolymerizable layer. The polymerized areas (cured portions) of the photopolymerizable layer have a higher melting temperature than the unpolymerized areas (uncured portions) and therefore do not melt, soften, or flow at the thermal development temperatures. The uncured portions can be removed from the cured portions of the composition layer by any means including air or liquid stream under pressure as described in U.S. publication 2004/0048199 A1, vacuum as described in Japanese publication 53-008655, and contacting with an absorbent material as described in U.S. Pat. No. 3,060,023; U.S. Pat. No. 3,264,103; U.S. Pat. No. 5,015,556; U.S. Pat. No. 5,175,072; U.S. Pat. No. 5,215,859; U.S. Pat. No. 5,279,697; and U.S. Pat. No. 6,797,454. A preferred method for removing the uncured portions is by contacting an outermost surface of the element to an absorbent surface, such as a development medium, to absorb or wick away or blot the melt portions.

The term "melt" is used to describe the behavior of the unirradiated (uncured) portions of the composition layer subjected to an elevated temperature that softens and reduces the viscosity to permit absorption by the absorbent material. The material of the meltable portion of the composition layer is usually a viscoelastic material which does not have a sharp transition between a solid and a liquid, so the process functions to absorb the heated composition layer at any temperature above some threshold for absorption in the development medium. Thus, the unirradiated portions of the composition layer soften or liquefy when subjected to an elevated temperature. However throughout this specification the terms "melting", "softening", and "liquefying" may be used to describe the behavior of the heated unirradiated portions of the composition layer, regardless of whether the composition may or may not have a sharp transition temperature between a solid and a liquid state. A wide temperature range may be utilized to "melt" the composition layer for the purposes of this invention. Absorption may be slower at lower temperatures and faster at higher temperatures during successful operation of the process.

The thermal treating steps of heating the photosensitive element and contacting an outermost surface of the element with development medium can be done at the same time, or in sequence provided that the uncured portions of the photopolymerizable layer are still soft or in a melt state when contacted with the development medium. The at least one photopolymerizable layer (and the additional layer/s) are heated by conduction, convection, radiation, or other heating methods to a temperature sufficient to effect melting of the uncured portions but not so high as to effect distortion of the cured portions of the layer. The one or more additional layers disposed above the photopolymerizable layer may soften or melt or flow and be absorbed as well by the development medium. The photosensitive element is heated to a surface temperature above about 40° C., preferably from about 40° C. to about 230° C. (104-446° F.) in order to effect melting or flowing of the uncured portions of the photopolymerizable layer. By maintaining more or less intimate contact of the development medium with the photopolymerizable layer that is molten in the uncured regions, a transfer of the uncured photosensitive material from the photopolymerizable layer to the development medium takes place. While still in the heated condition, the development medium is separated from the cured photopolymerizable layer in contact with the support layer to reveal the relief structure. A cycle of the steps of heating the photopolymerizable layer and contacting the molten (portions) layer with the development medium can be repeated as many times as necessary to adequately remove the uncured material and create sufficient relief depth. However, it is desirable to minimize the number of cycles for suitable system performance, and typically the photopolymerizable element is thermally treated for 5 to 15 cycles. Intimate contact of the development medium to the photopolymerizable layer (while in the uncured portions are melt) may be maintained by the pressing the layer and the development medium together.

Apparatuses suitable for thermally developing the photosensitive element are disclosed by Peterson et al. in U.S. Pat. No. 5,279,697, and also by Johnson et al. in U.S. Pat. No. 6,797,454. The photosensitive element in all embodiments is in the form of a plate. However, it should be understood that one of ordinary skill in the art could modify each of the disclosed apparatuses to accommodate the mounting of the photosensitive element in the form of a cylinder or a sleeve.

The development medium is selected to have a melt temperature exceeding the melt or softening or liquefying temperature of the unirradiated or uncured portions of the radiation curable composition and having good tear resistance at the same operating temperatures. Preferably, the selected material withstands temperatures required to process the photosensitive element during heating. The development medium may also be referred to herein as development material, absorbent material, absorbent web, and web. The development medium is selected from non-woven materials, paper stocks, fibrous woven material, open-celled foam materials, porous materials that contain more or less a substantial fraction of their included volume as void volume. The development medium can be in web or sheet form. The development medium should also possess a high absorbency for the molten elastomeric composition as measured by milligrams of elastomeric composition that can be absorbed per square centimeter of the development medium. It is also desirable that fibers are bonded in development mediums containing fibers so that the fibers are not deposited into the form during development. Non-woven nylon and polyester webs are preferred.

After the treatment step, the photosensitive element can be uniformly post-exposed to ensure that the photopolymerization process is complete and that the so formed flexographic printing plate will remain stable during printing and storage. This post-exposure step can utilize the same radiation source as the imagewise main exposure. Furthermore, if the surface of the flexographic printing plate is still tacky, detackification treatments may be applied. Such methods, which are also called "finishing", are well known in the art. For example, tackiness can be eliminated by a treatment of the flexographic printing plate with bromine or chlorine solutions. Preferably, detackification is accomplished by exposure to UV radiation sources having a wavelength not longer than 300 nm. This so-called "light-finishing" is disclosed in European Published Patent Application 0 017927 and U.S. Pat. No. 4,806,506. Various finishing methods may also be combined. Typically, the post-exposure and the finishing exposure are done at the same time on the photosensitive element using an exposure device that has both sources of radiation.

In another embodiment, the photosensitive layer is reinforced photochemically by overall exposure to actinic radiation to effect photohardening in depth prior to laser engraving. The layer of elastomeric composition can be photochemically reinforced during the manufacture of the element or during end-use as part of the formation of the element into a printing plate. The radiation source to effect photohardening of the elastomeric layer should be chosen so that the wavelength emitted matches the sensitive range for the Norrish type II photoinitator. This ultraviolet radiation source should furnish an effective amount of this radiation. In addition to sunlight, suitable high energy radiation sources include carbon arcs, mercury-vapor arcs, fluorescent tubes, and sub lamps are suitable. Lasers can be used if the intensity is sufficient only to initiate photohardening, and not to ablate material. The exposure time will vary depending upon the intensity and the spectral energy distribution of the radiation, its distance from the elastomeric composition, and the nature and amount of the elastomeric composition. A removable coversheet can be present during the exposure step provided that it is removed after exposure and prior to laser engraving.

After photohardening in the process of making a printing form from the photosensitive element, the photosensitive element is engraved with laser radiation. Laser engraving involves the absorption of laser radiation, localized heating and removal of material in three dimensions. The laser engraving process of the invention does not involve the use of a mask or stencil. This is because the laser impinges the reinforced layer to be engraved at or near its focus spot. Thus the smallest feature that can be engraved is dictated by the laser beam itself. The laser beam and the material to be engraved are in constant motion with respect to each other, so that each minute area of the plate (pixel) is individually addressed by the laser. The image information is fed into this type of system directly from the computer as digital data, rather than via a stencil. Any pattern of a single image or multiple images of the same or different images may be engraved.

Factors to be considered when laser engraving include, but are not limited to, deposition of energy into the depth of the element, thermal dissipation, melting, vaporization, thermally-induced chemical reactions such as oxidation, presence of air-borne material over the surface of the element being engraved, and mechanical ejection of material from the element being engraved. Investigative efforts with respect to engraving of metals and ceramic materials with a focused laser beam have demonstrated that engraving efficiency (the volume of material removed per unit of laser energy) and precision are strongly intertwined with the characteristics of the material to be engraved and the conditions under which laser engraving will occur. Similar complexities come into play when engraving elastomeric materials even though such materials are quite different from metals and ceramic materials.

Laser engravable materials usually exhibit some sort of intensity threshold, below which no material will be removed. Below the threshold it appears that laser energy deposited into the material is dissipated before the vaporization temperature of the material is reached. This threshold can be quite high for metals and ceramic materials. However, with respect to elastomeric materials it can be quite low. Above this threshold, the rate of energy input competes quite well with opposing energy loss mechanisms such as thermal dissipation. The dissipated energy near, though not in, the illuminated area may be sufficient to vaporize to material and, thus, the engraved features become wider and deeper. This effect is more pronounced with materials having low melting temperatures.

Laser engraving can be accomplished by any of various types of infrared lasers emitting infrared radiation in 9 to 12 micrometer wavelength, particularly 10.6 micrometers. The removal of material by the laser is aided by the presence of the additive sensitive to infrared radiation in the reinforced elastomeric layer which absorbs the radiation energy generated by the laser. A laser which is particularly suitable for engraving flexographic printing elements is a carbon dioxide laser which emits at 10.6 micrometer wavelength. Carbon dioxide lasers are commercially available at a reasonable cost. The carbon dioxide laser can operate in continuous-wave and/or pulse mode. Capability of operating the laser in both modes is desirable since at low or moderate radiation intensities, pulse engraving may be less efficient. Energy which might heat, even melt the material, but not vaporize it or otherwise cause it to become physically detached is lost. On the other hand, continuous wave irradiation at low or moderate intensities is accumulated in a given area while the beam scans the vicinity of that area. Thus at low intensities continuous wave mode may be preferred. Pulsed mode may be the preferred mode at high intensities because if a cloud of radiation absorbing material were formed, there would be time for it to dissipate in the time interval between pulses and, thus, it would permit a more efficient delivery of radiation to the solid surface.

Typically, the flexographic printing element is mounted onto an exterior of a rotating drum associated with the laser. The laser is focused to impinge on the element on the drum. As the drum is rotated and translated relative to the laser beam, the element is exposed to the laser beam in a spiral fashion. The laser beam is modulated with image data, resulting in a two dimensional image with relief engraved into the element, that is, a three-dimensional element. Relief depth is the difference between the thickness of the floor and the thickness of the printing layer. Alternately, the laser may move relative to the element on the drum.

The laser engravable flexographic printing elements described herein can be optionally treated to remove surface tackiness either before or after laser engraving. Suitable treatments which have been used to remove surface tackiness of styrene-diene block copolymers include treatment with bromine or chlorine solutions, and light finishing, i.e., exposure to radiation sources having a wavelength not longer than 300 nm. It should be understood that such treatment does not constitute a photochemical reinforcement of the elastomeric layer. Some embodiments of the Norrish type II photoinitiators are also operable at the wavelengths used for light-finishing.

In addition, these elements can be subjected to post-laser engraving treatments such as overall exposure to actinic radiation. Exposure to actinic radiation is generally intended to complete the chemical hardening process. This is particularly true for the floor and sidewall surfaces which are created by laser engraving.

EXAMPLES

Glossary

| Identifier | Ingredient | Manufacturer/Supplier |
|---|---|---|
| Aerosil R-812S | Hydrophobic silica | Evonik |
| CN307 | Acrylated polybutadiene oil with high vinyl content | Sartomer |
| CN2304 | Hexafunctionalized (hyperbranched) ester acrylate | Sartomer |
| D1192 | Styrene-Butadiene-Styrene (SBS) binder having 32% styrene and 8-10% pendant vinyl groups in the mid-block; no di-block content | Kraton Polymers |
| D1119 | Styrene-Isoprene-Styrene (SIS) binder having 22% styrene and 8-10% pendant vinyl groups in the mid-block; 65% di-block (SI) | Kraton Polymers |
| Esacure TZT | Photoinitiator which is a eutectic mixture of 2,4,6-trimethylbenzophenone (CAS 954-16-5) and 4-methylbenzophenone (CAS 134-84-9) | Sartomer |
| Esacure A122 | Tertiary amine functionalized with an acrylic group (acrylated amine) | Sartomer |
| HiBlack | Carbon black | Degussa |
| MYLAR® 601 | Polyethylene terephthalate (PET) fillm | DuPont Teijin Films |
| SM308 | Photoinitiator mixture of a Norrish type II initiator that is a ketosulphone derivative proprietary to Lamberti; a Norrish type I initiator that is Esacure KIP 200 which is 2-hydroxy-2-methyl-1-phenyl-1-propaneone; and a coinitiator that is Esacure A122 which is a tertiary amine functionalized with an acrylic group (acrylated amine). The ratio of each component in the photoinitiator mixture is proprietary to Lamberti. All three components were used in the same relative ratio to each other in all examples. | Lamberti |
| SR238 | Hexanediol diacrylate | Sartomer |
| Vor-Tough | A mixture of graphene at 10% (by weight) in an SBS binder that is D1192 (from Kraton Polymers) | Vorbeck |

In the following examples, the photopolymerizable layer was formed between two film sheets of the MYLAR® 601.

The percent transmittance of ultraviolet radiation through the photopolymerizable layer (without the PET sheets) was measured on a McBeth TD904 Densitometer.

Example 1

A mixture of 100 g of 01192, 40 g of D1119, 20 g of CN307, 10 g of SR238, 10 g of CN2304, SM308, and graphene at a level indicated in the following table) were mixed in a Brabender mixer for 10 minutes at 150° C. The SM308 was at 4% by weight of the composition. The resulting mixture was pressed in a mold in between two polyethylene terephthalate (PET) sheets, to form a photopolymerizable layer 25 mils thick, which was cut into three 6"×9" plate samples.

The transmittance of the plate sample to ultraviolet radiation was measured at about 7-8%.

Example 2

The preparation of the photopolymerizable layer of Example 1 was repeated except that the mixture contained graphene at 2% by weight.

The transmittance of the plate sample to ultraviolet radiation was measured at about 2-4%.

Comparative Example 1A and 1B

The preparation of the photopolymerizable layer of Example 1 was repeated except that the mixture did not contain graphene.

The transmittance of the plate sample to ultraviolet radiation was measured at about 80-90%.

Comparative Example 2

The preparation of the photopolymerizable layer of Example 1 was repeated except that the mixture did not contain graphene, but did contain Aerosil R-812S at the level indicated in the following table.

The transmittance of the plate sample was measured at about 80-90%.

Example 3

A mixture of 100 g of D1192, 40 g of D1119, 20 g of CN307, 10 g of SR238, 10 g of CN2304, 13.5 g of Aerosil R-812S, 10 g of Vor-Tough, and SM308 were mixed in the Brabender for 10 minutes at 150° C. The SM308 was at 4% by weight of the composition. The resulting mixture was pressed in a mold in between two PET sheets to form a photopolymerizable layer 25 mils thick, which was cut into three 6"×9" plate samples.

The transmittance of the plate sample was measured at bout 12%.

Example 4

A mixture of 100 g of D1192, 40 g of D1119, 20 g of CN307, 10 g of SR238, 10 g of CN2304, 11 g of Aerosil R-8123, 20 g of Vor-Tough, and SM308 were mixed in the Brabender for 10 minutes at 150° C. The SM308 was at 4% by weight of the composition. The resulting mixture was pressed in a mold in between two PET sheets to form a photopolymerizable layer 25 mils thick, which was cut into three 6"×9" plate samples.

The transmittance of the plate sample was measured and was about 3 to 5%.

Example 5

A mixture of 100 g of D1192, 40 g of D1119, 20 g of CN307, 10 g of SR238, 10 g of CN2304, 15 g of Aerosil R-812S, 20 g of Vor-Tough, and SM308 were mixed in the Brabender for 10 minutes at 150° C. The SM308 was at 4% by weight of the composition. The resulting mixture was pressed in a mold in between two PET sheets to form a photopolymerizable layer 25 mils thick, which was cut into three 6"×9" plate samples.

The transmittance of the plate sample was measured at about 3 to 5%.

Example 6

The preparation of the photopolymerizable layer of Example 4 was repeated except that the SM308 photoinitiator in the mixture was replaced with Esacure TZT at 3% by weight, and Esacure A122 at 2% by weight. The Esacure TZT is a Norrish type II photoinitiator, and Esacure A122 is a coinitiator.

The transmittance of the plate sample was measured at about 3 to 5%. (Similar to the other examples, the plate samples of Example 6 were exposed under 365 nm UV light for 5 minutes, and polymerized.)

Example 7

The preparation of the photopolymerizable layer of Example 1 was repeated except that the mixture contained graphene at 0.5% by weight.

The transmittance of the plate sample to ultraviolet radiation was measured at about 16-18%.

Control A

The preparation of the photopolymerizable layer of Example 5 was repeated except that the SM308 photoinitiator in the mixture was replaced with 2-phenyl,2,2-dimethyloxyacetophenone at 4% by weight.

The transmittance of the plate sample was measured at about 3 to 5%. The plate samples did not polymerize upon exposure to UV radiation, even after 20 minutes of exposure.

Control B

A mixture of 100 g of D1192, 40 g of D1119, 20 g of CN307, 10 g SR238, 10 a of CN2304, 10 g of HiBlack20, and SM308 were mixed in the Brabender for 10 minutes at 150° C. The SM308 was at 4% by weight of the composition.

The resulting mixture was pressed in a mold in between two PET sheets to form a photopolymerizable layer 25 mils thick, which was cut into three 6"×9" plate samples.

The transmittance of plate sample was measured at about 2-3%.

Five dog-bone shaped samples were cut from the plate samples and exposed under 365 nm UV light for 5 minutes. The PET film was removed from both sides of the sample. The dog-bone samples were then placed in an Instron 3344 (Instron, from Norwood, Mass.) tested for mechanical properties of toughness and stress-at-break on using a load cell of 100 Newton, according to procedure recommended by the manufacturer. The mechanical tests on the 5 shaped samples are reported as an average in the following table. Of the remaining plate samples, a piece of 2"×2" from each plate sample was exposed for 5 minutes at 365 nm and then immersed into a jar containing toluene. The sample pieces were left in the toluene for 24 hours then dried in air for an hour before their thickness and the % swelling was measured. The results are presented in the following table.

| | % Dark reinforcing agent | % Silica | Toughness (kPa) | Stress-at-Break (kPa) | Swelling % |
|---|---|---|---|---|---|
| Example 1 | 1% graphene | 0 | 122 | 108 | 3.1% |
| Example 2 | 2% graphene | 0 | 116 | 99 | 1.6% |
| Comparative Example 1A | 0 | 0 | Not tested | Not tested | 100% (sample not exposed) sample dissolved in solvent |

-continued

|  | % Dark reinforcing agent | % Silica | Toughness (kPa) | Stress-at-Break (kPa) | Swelling % |
|---|---|---|---|---|---|
| Comparative Example 1B | 0 | 0 | 123 | 106 | 14.6% (exposed plate) |
| Comparative Example 2 | 0 | 7 | 1167 | 1308 | 6.1% |
| Example 3 | 0.5% graphene | 7 | 1208 | 1412 | 4.5% |
| Example 4 | 1% graphene | 5 | 850 | 914 | 2.4% |
| Example 5 | 1% graphene | 7 | 1285 | 1533 | 2.0% |
| Example 6 | 1% graphene | 5 | 882 | 966 | 2.3% |
| Example 7 | 0.5% graphene | 0 | 121 | 111 | 4.2% |
| Control A | 1% graphene | 7 | Not tested | Not tested | — |
| Control B1 | 5% carbon black | 0 | Not tested | Not tested | 100% (sample not exposed) sample dissolved in solvent |
| Control B2 | 5% carbon black | 0 | 122 | 110 | 13.8% (exposed sample) |

Control A versus Example 5, demonstrated the need for a photopolymerizable layer that contains a dark reinforcing agent to also include a Norrish type II photoinitiator and coinitiatior.

Controls B1 and B2 demonstrated that the presence of conventional dark reinforcing agent, carbon black, provided no particular advantages in mechanical performance or solvent resistance when compared to Comparative Examples 1A and 1B which did not have any reinforcing agent.

Examples 1 and 2 demonstrated that the presence of graphene as a dark reinforcing agent in the photopolymerizable layer surprisingly improved solvent resistance of the layer when compared to Control 2B having carbon black as the reinforcing agent. Even though Examples 1 and 2 had minimal improvement of the mechanical properties compared to those samples having no reinforcing agents (Comparative B1) or carbon black as reinforcing agent (Control B2), the improvement in solvent resistance provides suitable advantage over other photosensitive layers.

Example 6 demonstrated that a Norrish type II photoinitiator (with coinitiator) is sufficient to cure the photosensitive layer having the dark reinforcing particles of graphene when compared to Example 4 which included a Norrish type I photoinitiator with the Norrish type II and coinitiator in the photosensitive composition.

Although Comparative Example 2 demonstrated that the presence of silica in the photopolymerizable layer provided some increase the solvent resistance (compared to Comparative Example 1B), the addition of graphene as shown in Examples 3, 4, and 5 provided significant improvement in the solvent resistance of the photopolymerizable layer. The lower the % swelling the more resistant the layer is to solvent attack. Examples 3 and 5 also demonstrated that the presence of graphene in the photopolymerizable layer provided a significant improvement in mechanical performance compared to Comparative Example 2 which had only silica in the photopolymerizable layer. It is expected that the samples having higher values for the toughness and stress-at-break would exhibit improved wear resistance upon printing on press.

The samples of Examples 4 and 5 were exposed to ultraviolet radiation at 365 nm for 10 minutes (1250 Joules/cm$^2$), and imaged using a CYREL® Digital Imager infrared laser radiation exposure unit (CDI Spark 2530 made by Esko Graphics Imaging GmbH) at 325 rpm for the drum speed and 18 W of power. Typically, the CYREL® Digital Imager is used to selectively ablate, i.e., remove very thin layer of material but not used for in-depth removal (i.e., in the order of 10-15 micron thickness). However, the present tests were conducted such that the IR laser radiation in the CYREL® Digital Imager engraved the photocured layer, i.e., removed the cured material, in-depth. The plate samples were engraved with 200 lpi image having letters approximately 8-12 microns (0.5 mils) deep. It is expected that the samples could be easily engraved to a depth of 2 to 3 mils if a different laser radiation exposure unit, particularly one with more power, was used.

Example 7 demonstrated a significant improvement in solvent resistance but had similar performance in mechanical properties when compared to Comparative Example 1B. The presence of even 0.5% graphene in the plate sample resulted in the sample having solvent swelling of about three fold less than that exhibited by Comparative Example 1B. It is expected that even less swelling would be exhibited by the sample of Example 7 in solvents less potent than toluene.

In the above Examples and Comparatives the overall exposure of the plate samples to radiation at 365 nm for 5 minutes was sufficient to polymerize or cure the photopolymerizable layer in the samples, for even those plate samples which were dark and contained the Norrish type II photoinitiator. It is expected that the photopolymerizable layer of the plate samples would polymerize or cure if exposed to radiation at 354 nm for about the same time.

What is claimed is:

1. A photosensitive printing form element comprising:
   a solid layer of a photosensitive composition comprising an elastomeric binder, a monomer, and a Norrish type II photoinitiator;
   wherein the solid photosensitive layer contains reinforcing particles that provide the layer with a transmittance to actinic radiation of less than 20%, and wherein the reinforcing particles are selected from the group consisting of graphene, carbon nanotubes, and combinations thereof.

2. The photosensitive element of claim 1 wherein the reinforcing particles are in an amount from about 0.4 to 30% by weight, based on the weight of the photosensitive composition.

3. The photosensitive element of claim 1 wherein the photosensitive composition further comprises additional reinforcing particles selected from the group consisting of carbon black, graphite, furnace black, dark pigments, and dark toners.

4. The photosensitive element of claim 1 wherein the photosensitive composition further comprises additional reinforcing particles selected from the group consisting of $TiO_2$, calcium carbonate, calcium silicate, barium sulfate, mica, zinc oxide, magnesium oxide, titanium oxide, aluminum, and alumina, materials having silica-oxygen (Si—O bond) functionality, materials having phosphorus-oxygen (P—O bond) functionality, pigment particles, toner particles, and combinations thereof.

5. The photosensitive element of claim 1 wherein the Norrish type II photoinitiator is selected from the group consisting of benzophenones, ketosulphones, thioxanthones, 1,2-diketones, anthraquinone, fluorenones, xanthones, acetophenone derivatives, benzoin ethers, benzyl ketals, phenylglyoxylates, mono-acylphosphine, and bis-acylphosphine.

6. The photosensitive element of claim 1 wherein the photoinitiator is a ketosulphone.

7. The photosensitive element of claim 1 further comprising a coinitiator with the photoinitiator.

8. The photosensitive element of claim 7 wherein the coinitiator is selected from the group consisting of thiols, aldehydes, secondary alcohols, primary amines, secondary amines, and tertiary amines.

9. The photosensitive element of claim 7 wherein the photoinitiator is a ketosulphone and the coinitiator is an amine.

10. The photosensitive element of claim 1 wherein the layer has a transmittance to actinic radiation of less than 5%.

11. The photosensitive element of claim 1 wherein the binder includes sufficient pendant alkyl groups of 1 to 6 carbon atoms for donating hydrogen upon reaction with the Norrish type II photoinitiator.

12. The photosensitive element of claim 1 wherein the layer has a thickness from 2 to 250 mils.

13. The photosensitive element of claim 1 wherein the photosensitive layer has a transmittance to actinic radiation of less than 15%.

14. The photosensitive element of claim 1 wherein the photosensitive layer has a transmittance to actinic radiation of less than 10%.

15. A method for preparing a printing form from a photosensitive printing form element comprising:
a) providing the photosensitive printing form element comprising a solid layer of a photosensitive composition comprising an elastomeric binder, a monomer, and a Norrish type II photoinitiator, wherein the solid photosensitive layer contains reinforcing particles that provide the layer with a transmittance to actinic radiation of less than 20%, and wherein the reinforcing particles are selected from the group consisting of graphene, carbon nanotubes, and combinations thereof;
b) exposing the photosensitive element to actinic radiation; and
c) treating the exposed photosensitive element to form a relief surface suitable for printing.

16. The method of claim 15 wherein the exposing step is an imagewise exposure through a mask to form polymerized portions and unpolymerized portions, and the treating step is selected from the group consisting of
(a) processing with at least one washout solution selected from the group consisting of solvent solution, aqueous solution, semi-aqueous solution, and water; and
(b) heating the element to a temperature sufficient to cause unpolymerized portions to melt, flow, or soften, and removing the unpolymerized portions.

* * * * *